(12) United States Patent
Lee

(10) Patent No.: US 8,270,221 B2
(45) Date of Patent: Sep. 18, 2012

(54) NONVOLATILE MEMORY DEVICE AND METHOD OF OPERATING THE SAME

(75) Inventor: Ju Yeab Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 307 days.

(21) Appl. No.: 12/780,192

(22) Filed: May 14, 2010

(65) Prior Publication Data
US 2011/0134704 A1 Jun. 9, 2011

(30) Foreign Application Priority Data
Dec. 7, 2009 (KR) .......................... 10-2009-0120366

(51) Int. Cl.
G11C 16/06 (2006.01)
(52) U.S. Cl. .......... 365/185.22; 365/185.25; 365/189.05
(58) Field of Classification Search ............. 365/185.12, 365/185.17, 185.18, 285.23, 185.24, 185.25, 365/189.05
See application file for complete search history.

(56) References Cited

U.S. PATENT DOCUMENTS

| | | | | |
|---|---|---|---|---|
| 6,826,082 B2 * | 11/2004 | Hwang et al. | ............ | 365/185.17 |
| 7,551,492 B2 * | 6/2009 | Kim | ......................... | 365/185.29 |
| 7,813,186 B2 * | 10/2010 | Park et al. | ................ | 365/189.02 |
| 7,916,547 B2 * | 3/2011 | Hosono | ..................... | 365/185.21 |
| 2003/0076719 A1 * | 4/2003 | Byeon et al. | .................. | 365/200 |
| 2007/0263438 A1 * | 11/2007 | Chen | ........................ | 365/185.03 |
| 2009/0073763 A1 | 3/2009 | Hosono | | |

FOREIGN PATENT DOCUMENTS

| KR | 100597914 | 7/2006 |
|---|---|---|
| KR | 1020100074667 | 7/2010 |

OTHER PUBLICATIONS

Notice of Preliminary Rejection issued from Korean Intellectual Property Office on Feb. 16, 2011.

* cited by examiner

*Primary Examiner* — Gene Auduong
(74) *Attorney, Agent, or Firm* — IP & T Group LLP

(57) ABSTRACT

A nonvolatile memory device includes a cell string, including a drain select transistor coupled to a bit line, a source select transistor coupled to a common source line, and memory cells coupled in series between the drain select transistor and the source select transistor, a latch unit, including a first latch for storing a detection result of a threshold voltage of a second memory cell adjacent to a first memory cell selected from among the memory cells and a second latch for storing a detection result of a threshold voltage of the first memory cell, and a first reset unit electrically coupled between the first and second latches and configured to reset the second latch, during a time in which a read operation is performed on the first memory cell, in response to a first reset signal and the detection result stored in the first latch.

25 Claims, 7 Drawing Sheets

NONVOLATILE MEMORY DEVICE AND METHOD OF OPERATING THE SAME

CROSS-REFERENCE TO RELATED APPLICATION

Priority to Korean patent application number 10-2009-0120366 filed on Dec. 7, 2009, the entire disclosure of which is incorporated by reference herein, is claimed.

BACKGROUND

Exemplary embodiments relate to a nonvolatile memory device and a method of operating the same and, more particularly, to a nonvolatile memory device and a method of operating the same, which are capable of reducing the likelihood of an error when performing a read operation.

In order to increase memory capacity, a higher degree of integration of nonvolatile memory devices may be implemented. From among the nonvolatile memory devices, a NAND flash memory device is advantageous in the higher degree of integration because the NAND flash memory device has a number of memory cells coupled in series together to form one cell string. Accordingly, demand for the NAND flash memory device is increasing.

FIG. 1 is a cross-sectional view showing the cell string structure of a known NAND flash memory device.

Referring to FIG. 1, a string of the NAND flash memory device includes a number of memory cells MC0 to MC31 coupled in series between a source select transistor (not shown) and a drain select transistor (not shown).

Each of the memory cells MC0 to MC31 has a stack type gate in which a gate insulating layer 15, a floating gate 17, a dielectric layer 19, and a control gate 21 are sequentially stacked over a semiconductor substrate 11. Junctions 13 are formed by implanting impurity ions into the semiconductor substrate 11 on both sides of each of the memory cells MC0 to MC31.

The above-described NAND flash memory device is programmed or erased in such a manner that electrons are injected into or emitted from the floating gate 17 in accordance with the Fowler-Nordheim tunneling method in order to control the threshold voltages of the memory cells.

To further increase the memory capacity of the device, a Multi Level Cell (hereinafter referred to as an 'MLC'), capable of storing data of 2 bits or more in one memory cell, is used. The MLC has two or more data storage states, and the data storage states correspond to respective threshold voltage distributions.

Each of the memory cells MC0 to MC31 is programmed to have a threshold voltage higher than a predefined verification level depending on data to be programmed. The verification level differs depending on the data to be programmed, and it is set lower than a read voltage supplied during a read operation by taking a read margin into consideration. The program threshold voltage of a specific cell, after being programmed, can rise under the influence of subsequent program operations performed on neighboring cells.

Meanwhile, to read data stored in a memory cell selected from among the memory cells MC0 to MC31, a read voltage is supplied to the selected memory cell, and a read pass voltage for forming a channel is supplied to each of the remaining unselected memory cells. Here, if the program threshold voltages of memory cells adjacent to the selected memory cell have excessively risen, an error can occur in the read operation of the selected memory cell.

For example, it is assumed that the selected memory cell (e.g., MC1) has been normally programmed, and the program threshold voltage of at least one of the memory cells MC0 and MC2, adjacent to the selected memory cell MC1, has been excessively increased and is higher than that of the selected memory cell MC1. Here, to perform the read operation, the read voltage is supplied to the selected memory cell MC1, and the read pass voltage is supplied to each of the remaining unselected memory cells MC0 and MC2 to MC31. The read operation is performed by determining the on/off state of the selected memory cell MC1 according to whether a current path is formed in the cell string when the read pass voltage and the read voltage are supplied. Accordingly, for the purpose of a correct read operation, a channel must be formed in the semiconductor substrate 11 (i.e., the semiconductor substrate 11 between the junctions 13), beneath the gate patterns of the unselected memory cells MC0 and MC2 to MC31 that are supplied with the read pass voltage. However, if the program threshold voltage of at least one of the unselected memory cells MC0 and MC2, adjacent to the selected memory cell MC1, has excessively risen and is higher than that of the selected memory cell MC1, the channel may not be formed in at least one of the memory cells MC0 and MC2 adjacent to the selected memory cell MC1. Consequently, when the read operation is performed on the selected memory cell MC1, the selected memory cell MC1 is recognized as an off state irrespective of a level of the read voltage supplied to the selected memory cell MC1, and so the program state of the selected memory cell MC1 is not correctly read. This phenomenon becomes more profound with a reduction in the gap between the memory cells according to the higher degree of integration of the devices.

BRIEF SUMMARY

Exemplary embodiments relate to a nonvolatile memory device and a method of operating the same, which are capable of reducing the likelihood of an error when performing a read operation.

A nonvolatile memory device according to an aspect of this disclosure comprises a cell string configured to include a drain select transistor coupled to a bit line, a source select transistor coupled to a common source line, and a number of memory cells coupled in series between the drain select transistor and the source select transistor, a latch unit configured to include a first latch and a second latch, the first latch storing a detection result of a threshold voltage of a second memory cell adjacent to a first memory cell selected from among the memory cells, and the second latch storing a detection result of a threshold voltage of the first memory cell, a bit line coupling unit configured to electrically couple the bit line and the latch unit together, and a first reset unit electrically coupled between the first and second latches and configured to reset the second latch, during a time in which a read operation is performed on the first memory cell, in response to a first reset signal and the detection result stored in the first latch.

The first reset unit may include an AND gate outputting data obtained by performing an AND operation on the first reset signal and the detection result stored in the first latch and a first reset transistor coupling a ground voltage input terminal and the second latch unit together in response to the data output by the AND gate.

The latch unit may include a first transistor supplying a ground voltage in response to a voltage level of the bit line, a second transistor coupling the second latch and the first transistor together in response to a first latch control signal, and a third transistor coupling the first latch and the first transistor in response to a second latch control signal.

The nonvolatile memory device may further include a second reset unit coupled to the second latch and configured to reset the second latch in response to a second reset control signal.

The nonvolatile memory device may further include a third reset unit coupled to the first latch and configured to reset the first latch in response to a third reset control signal.

If the first memory cell is not a memory cell adjacent to the source select transistor, the second memory cell may be a memory cell adjacent to the first memory cell on the side of the source select transistor.

If the first memory cell is a memory cell adjacent to the source select transistor, the second memory cell may be a memory cell adjacent to the first memory cell on the side of the drain select transistor.

A method of operating a nonvolatile memory device according to an aspect of this disclosure, including a string in which a number of memory cells, on which a program operation and a verification operation using a number of verification voltages have been performed, are coupled in series, the method includes comparing a threshold voltage of a second memory cell, adjacent to a first memory cell, which is selected from among the memory cells during a read operation, and a reference voltage, which is higher than a highest verification voltage of the verification voltages, but lower than a first read pass voltage, and when the threshold voltage of the second memory cell is higher than the reference voltage, performing the read operation on the first memory cell by supplying a read voltage to the first memory cell, a second read pass voltage, which is higher than the first read pass voltage, to the second memory cell, and the first read pass voltage to remaining memory cells.

When the threshold voltage of the second memory cell is lower than the reference voltage, the method may further include performing the read operation on the first memory cell by supplying the read voltage to the first memory cell and the first read pass voltage to remaining memory cells, including the second memory cell.

If the first memory cell is not a memory cell adjacent to a source select transistor, the second memory cell may be a memory cell adjacent to the first memory cell on the side of the source select transistor.

If the first memory cell is a memory cell adjacent to a source select transistor, the second memory cell may be a memory cell adjacent to the first memory cell on the side of a drain select transistor.

A method of operating a nonvolatile memory device according to another aspect of this disclosure, including a string, including a drain select transistor coupled to a bit line, a source select transistor coupled to a common source line, and a number of memory cells coupled in series between the drain select transistor and the source select transistor, includes performing a program operation and a verification operation, using a number of verification voltages, to store data in the memory cells, comparing a threshold voltage of a second memory cell, adjacent to a first memory cell, which is selected from among the memory cells for a read operation, and a reference voltage, which is higher than a highest verification voltage of the verification voltages, but lower than a first read pass voltage supplied to unselected memory cells during the read operation, performing a first read operation for reading data stored in the first memory cell by supplying a read voltage to the first memory cell and the first read pass voltage to the unselected memory cells, when the threshold voltage of the second memory cell is higher than the reference voltage, resetting the data read by the first read operation, and when the data read by the first read operation is reset, performing a second read operation for reading data stored in the first memory cell by supplying the read voltage to the first memory cell, a second read pass voltage, which is higher than the first read pass voltage, to the second memory cell, and the first read pass voltage to remaining memory cells.

Comparing the threshold voltage of the second memory cell and the reference voltage may include discharging the bit line, supplying a first voltage to a transistor electrically coupled between the bit line and a sense node to turn on the transistor, turning off the transistor, and detecting a change in a voltage level of the sense node by supplying a second voltage, which is lower than the first voltage, to the transistor.

Data according to the change in the voltage level of the sense node may be stored in a first latch electrically coupled to the sense node.

Performing the first read operation may include discharging the bit line, supplying a first voltage to a transistor electrically coupled between the bit line and a sense node to turn on the transistor, turning off the transistor, and detecting a change in a voltage level of the sense node by supplying a second voltage, which is lower than the first voltage, to the transistor.

Detecting the change in the voltage level of the sense node during the first read operation may be performed using a first transistor for supplying a ground voltage in response to the voltage level of the sense node and a second transistor coupled to the first transistor in response to a first latch control signal.

Data according to the change in the voltage level of the sense node during the first read operation may be stored in a second latch electrically coupled to the sense node.

The sense node and the second latch may be electrically coupled together through the first transistor and the second transistor, which couples the second latch and the first transistor together in response to the first latch control signal.

The sense node and the first latch may be electrically coupled together through a first transistor for supplying a ground voltage in response to the voltage level of the sense node and a third transistor for coupling the first latch and the first transistor together in response to a second latch control signal.

Resetting the data read by the first read operation may be performed using a first reset transistor responding to a signal obtained by performing an AND operation of a first reset control signal and data according to a result of comparing the threshold voltage of the second memory cell and the reference voltage.

The method may further include resetting the second latch using a second reset transistor for resetting the second latch in response to a second reset control signal, before comparing the threshold voltage of the second memory cell and the reference voltage.

The method may further include resetting the first latch using a third reset transistor for resetting the first latch in response to a third reset control signal, before comparing the threshold voltage of the second memory cell and the reference voltage.

Performing the second read operation may include turning off the transistor and detecting a change in a voltage level of the sense node by supplying a third voltage lower than the second voltage to the transistor.

Performing the second read operation may include turning off the transistor and precharging the sense node, turning on the transistor by supplying the first voltage to the transistor, turning off the transistor, and detecting a change in a voltage level of the sense node by supplying the second voltage, which is lower than the first voltage, to the transistor. Here, the drain select transistor and the source select transistor may be turned off during a time in which the sense node is precharged in the second read operation.

DESCRIPTION OF EMBODIMENTS

Hereinafter, some exemplary embodiments of this disclosure will be described in detail with reference to the accompanying drawings. The figures are provided to allow those having ordinary skill in the art to understand the scope of the embodiments of the disclosure.

Figure 1:
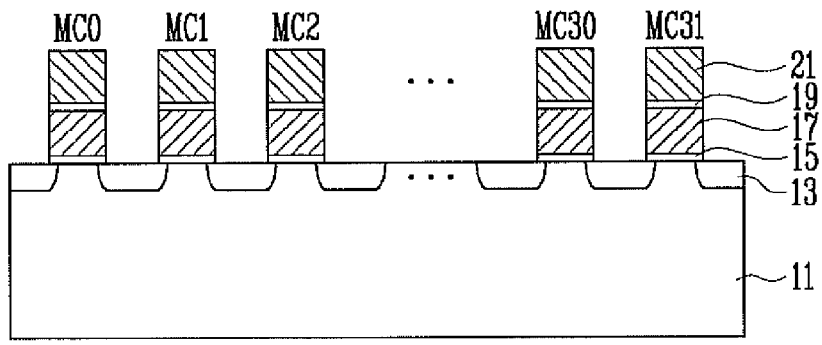
FIG. 1 is a cross-sectional view showing the string structure of a known NAND flash memory device.
Figure 2:
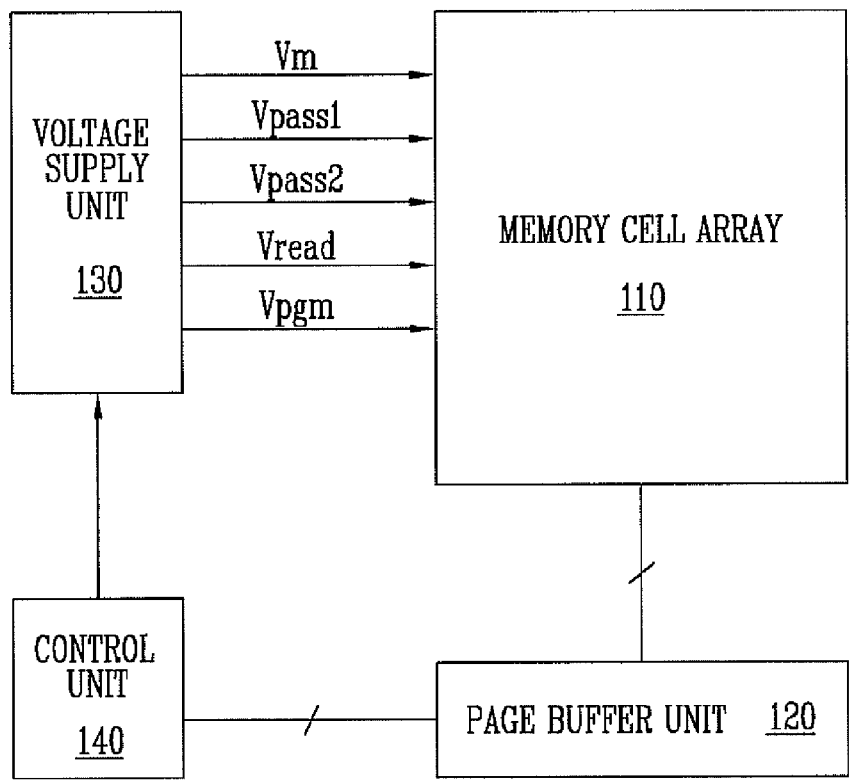
FIG. 2 is a block diagram showing an exemplary nonvolatile memory device according to this disclosure.
Figure 3:
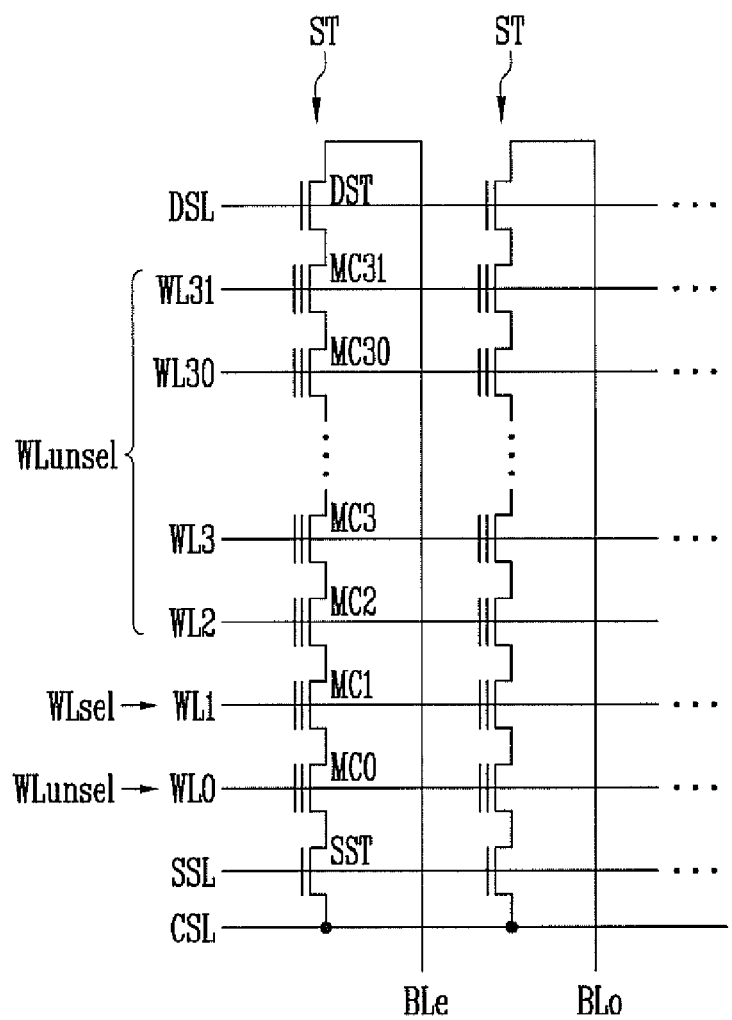
FIG. 3 is a diagram showing a memory cell array shown in FIG. 2.
Figure 4:
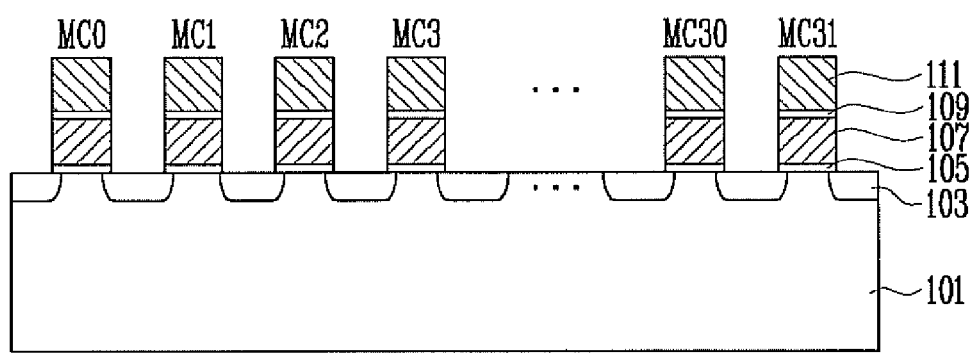
FIG. 4 is a cross-sectional view of memory cells shown in FIG. 3.

FIGS. 2 to 4 are diagrams illustrating an exemplary nonvolatile memory device according to this disclosure. More particularly, FIG. 2 is a block diagram showing an exemplary nonvolatile memory device, FIG. 3 is a diagram showing a memory cell array shown in FIG. 2, and FIG. 4 is a cross-sectional view of memory cells shown in FIG. 3.

The exemplary nonvolatile memory device according to this disclosure, as shown in FIG. 2, includes a memory cell array 110, a page buffer unit 120, a voltage supply unit 130, and a control unit 140.

The memory cell array 110, as shown in FIG. 3, includes a number of cell strings ST each coupled between a common source line CSL and a bit line BLe or BLo. Each of the cell strings ST includes a number of memory cells MC0 to MC31 coupled in series between a drain select transistor DST and a source select transistor SST.

The drain select transistor DST couples the cell string ST and the bit line (e.g., BLe) together, and the source select transistor SST couples the cell string ST and the common source line CSL together. The gates of the drain select transistors DST are commonly coupled to a drain selection line DSL, and the gates of the source select transistors SST are commonly coupled to a source selection line SSL. Furthermore, the gates of the memory cells MC0 to MC31, as shown in FIG. 3, are respectively coupled to a number of word lines WL0 to WL31. Moreover, the gates of corresponding memory cells in each cell string ST are commonly coupled to the same word line. For example, the gates of memory cell MC1 in each cell string ST are commonly coupled to word line WL1.

Meanwhile, as shown in FIG. 4, each of the memory cells MC0 to MC31 included in the cell string ST has a stack type gate in which a gate insulating layer 105, a floating gate 107, a dielectric layer 109, and a control gate 111 are sequentially stacked over a semiconductor substrate 101. Junctions 103 are formed by implanting impurity ions into the semiconductor substrate 101 on both sides of each of the memory cells MC0 to MC31. When a program operation is performed, each of the memory cells MC0 to MC31 is programmed to store data, corresponding to a desired threshold voltage, through control of the threshold voltage by injecting electrons into the floating gate 107.

The page buffer unit 120 may include a plurality of page buffers that are each coupled to one or more of the bit lines BLe, BLo. Also, each of the page buffers may have one or more latch circuits. Further, each of the page buffers is configured to latch data to be programmed or to read data stored in the memory cell and store the read data.

The control unit 140 generates one or more control signals to control the operations of the nonvolatile memory device.

The voltage supply unit 130, as shown in FIG. 2, generates operating voltages, such as a reference voltage Vm, a program voltage Vpgm, first and second read pass voltages Vpass1, Vpass2, and a read voltage Vread, in response to the control signals generated by the control unit 140.

Figure 5:
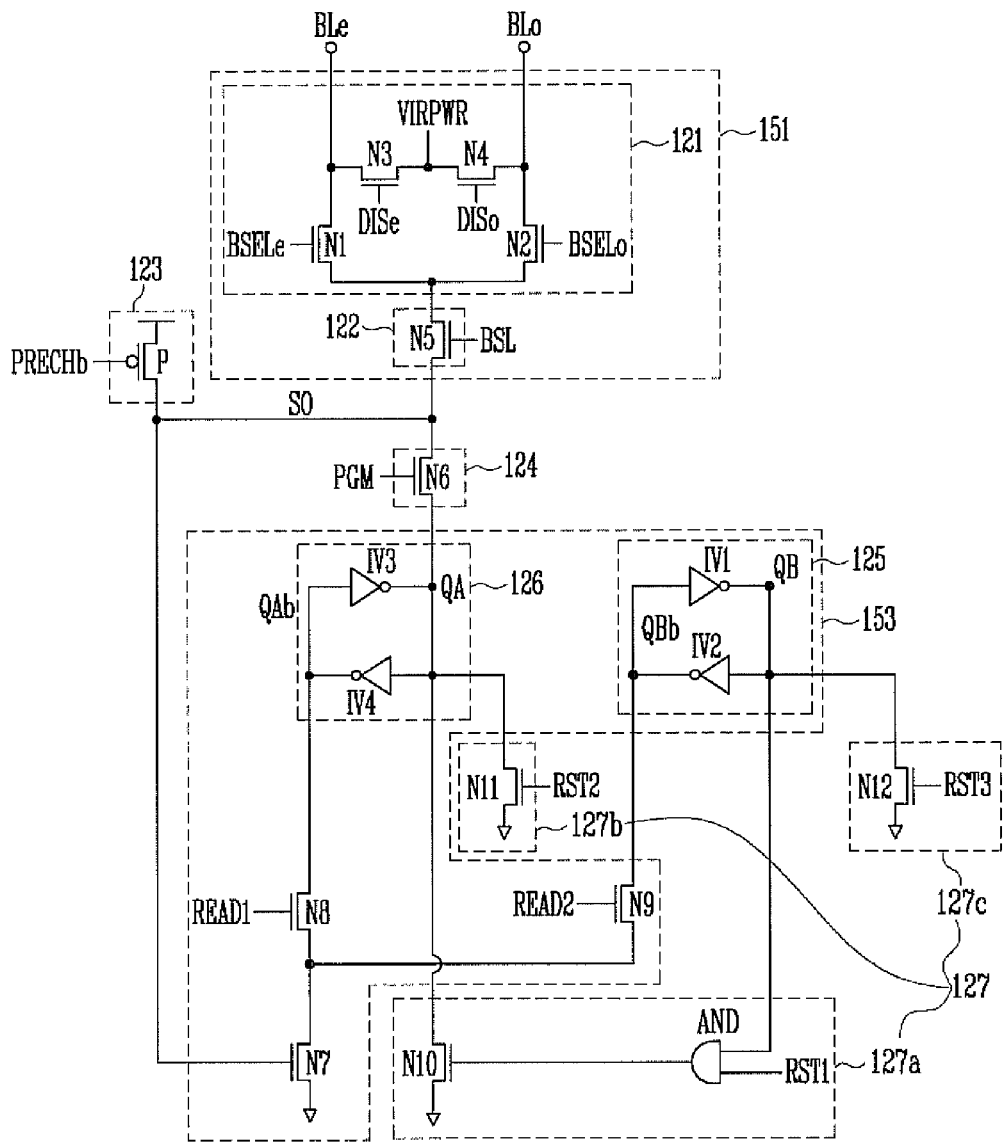
FIG. 5 is a circuit diagram of an exemplary page buffer according to this disclosure.

FIG. 5 is a circuit diagram of an exemplary page buffer according to this disclosure.

Referring to FIG. 5, the page buffer includes a bit line coupling unit 151, a sense node precharge unit 123, a data transfer unit 124, a latch unit 153, and a reset unit 127.

The bit line coupling unit 151 can include a bit line selector 121 and a bit line detector 122. The bit line selector 121 and the bit line detector 122 electrically couple a bit line (e.g., BLe), coupled to a cell string ST selected from among the cell strings ST shown in FIG. 3, to the latch unit 153.

The bit line selector 121 includes NMOS transistors N1, N2 for coupling the bit lines BLe, BLo and the bit line detector 122 together in response to bit line selection signals BSELe, BSELo.

The bit line selector 121 further includes a control signal input terminal for supplying a control signal VIRPWR of a specific level and NMOS transistors N3, N4 for coupling the bit lines BLe, BLo and the control signal input terminal together in response to even and odd discharge signals DISe, DISo. The bit line selector 121 precharges a selected bit line to a high logic level or discharges the selected bit line to a low logic level according to a voltage level of the control signal VIRPWR.

The bit line detector 122 includes a bit line sense transistor N5 for coupling a selected bit line and a sense node SO together in response to a bit line sense signal BSL. The bit line sense signal BSL can have a first voltage, a second voltage with a voltage level that is lower than the first voltage, or a third voltage with a voltage level which is equal to or lower than the voltage level of the second voltage. However, in another embodiment, the bit line detector 122 may be omitted, and the bit line selector 121 and the sense node SO are directly coupled together. In such an embodiment, the bit line selection signal BSELe or BSELo may have a first voltage, a second voltage with a voltage level that is lower than the first voltage, or a third voltage which is equal to or lower than the voltage level of the second voltage.

Still referring to FIG. 5, the sense node precharge unit 123 couples the sense node SO and a power source voltage input terminal together so that the sense node SO is precharged to a high logic level. The sense node precharge unit 123 may include a PMOS transistor P. The PMOS transistor P couples the sense node SO and the power source voltage input terminal together in response to a precharge signal PRECHb of a low logic level. The sense node SO is coupled to a selected bit line through the bit line coupling unit 151 and configured to detect a change in the voltage level of the selected bit line.

The latch unit 153 includes a first latch 125, a second latch 126, and first to third transistors N7, N8, and N9.

The first latch 125 stores a detection result of the threshold voltage of a second memory cell adjacent to a first memory cell, selected from among the memory cells included in a cell string. To this end, the first latch 125 includes first and second inverters IV1, IV2. Here, the output terminal of the first inverter IV1 and the input terminal of the second inverter IV2 are coupled to a first latch node QB. The output terminal of the second inverter IV2 and the input terminal of the first inverter IV1 are coupled to a second latch node QBb. Accordingly, when data of a high logic level (e.g., '1') is supplied to the first latch node QB, the second inverter IV2 inverts the corresponding data, so data of a low logic level (e.g., '0') is supplied to the second latch node QBb. Then the first inverter IV1 inverts the data of a low logic level (e.g., '0'), so the data of a high logic level, supplied to the first latch node QB, remains intact. This result is called a data retention effect. Similarly, when data of a low logic level (e.g., '0') is supplied to the first latch node QB, the second inverter IV2 inverts the corresponding data, so data of a high logic level (e.g., '1') is supplied to the second latch node QBb. Then the first inverter IV1 inverts the data of a high logic level, so the data of a low logic level supplied to the first latch node QB remains intact.

The second latch 126 stores a result of detecting a threshold voltage of the first memory cell, which is selected from among the memory cells included in a cell string. To this end, the second latch 126 includes third and fourth inverters IV3, IV4. Here, the output terminal of the third inverter IV3 and the input terminal of the fourth inverter IV4 are coupled to a third latch node QA. The output terminal of the fourth inverter IV4 and the input terminal of the third inverter IV3 are coupled to a fourth latch node QAb. The second latch 126 retains and stores data according to the same principle of the first latch 125.

The first transistor N7 supplies a ground voltage in response to a voltage level of a selected bit line detected by the sense node SO. The second transistor N8 couples the second latch 126 and the first transistor N7 together in response to a first latch control signal READ1. The third transistor N9 couples the first latch 125 and the first transistor N7 in response to a second latch control signal READ2. Accordingly, when both the first and second transistors N7, N8 are turned on, data of a low logic state (e.g., '0') is generated in the fourth latch node QAb. When both the first and third transistors N7, N9 are turned on, data of a low logic state (e.g., '0') is generated in the second latch node QBb.

The reset unit 127 includes first to third reset units 127a, 127b, and 127c.

The first reset unit 127a controls a reset operation of the second latch 126 in response to data stored in the first latch 125. To this end, the first reset unit 127a includes an AND gate AND and a first reset transistor N10 having a gate that is coupled to the output terminal of the AND gate AND. Here, the first reset transistor N10 is coupled between the third latch node QA and the ground voltage. Therefore, the first reset transistor N10 supplies the ground voltage to the third latch node QA in response to a signal output from the output terminal of the AND gate AND. The signal output from the output terminal of the AND gate AND is a result of performing an AND operation on data of the first latch node QB and a first reset control signal RST1 inputted to the input terminal of the AND gate AND.

For example, when data of a high logic level is generated in the first latch node QB of the first latch 125 and the first reset control signal RST1 of a high logic level is inputted to the first reset unit 127, data stored in the third latch node QA is reset.

The second reset unit 127b includes a second reset transistor N11 which is turned on in response to a second reset control signal RST2. The second reset transistor N11 is coupled between the ground voltage and the third latch node QA of the second latch 126. Accordingly, when the second reset transistor N11 is turned on in response to the second reset control signal RST2, data stored in the third latch node QA is reset.

The third reset unit 127c includes a third reset transistor N12 which is turned on in response to a third reset control signal RST3. The third reset transistor N12 is coupled between the ground voltage and the first latch node QB of the first latch 125. Accordingly, when the third reset transistor N12 is turned on in response to the third reset control signal RST3, data stored in the first latch node QB is reset.

The data transfer unit 124 includes a transfer transistor N6 coupled between the sense node SO and the first latch node QA. The transfer transistor N6 is turned on or turned off in response to a program control signal PGM provided during a program operation.

Figure 6:
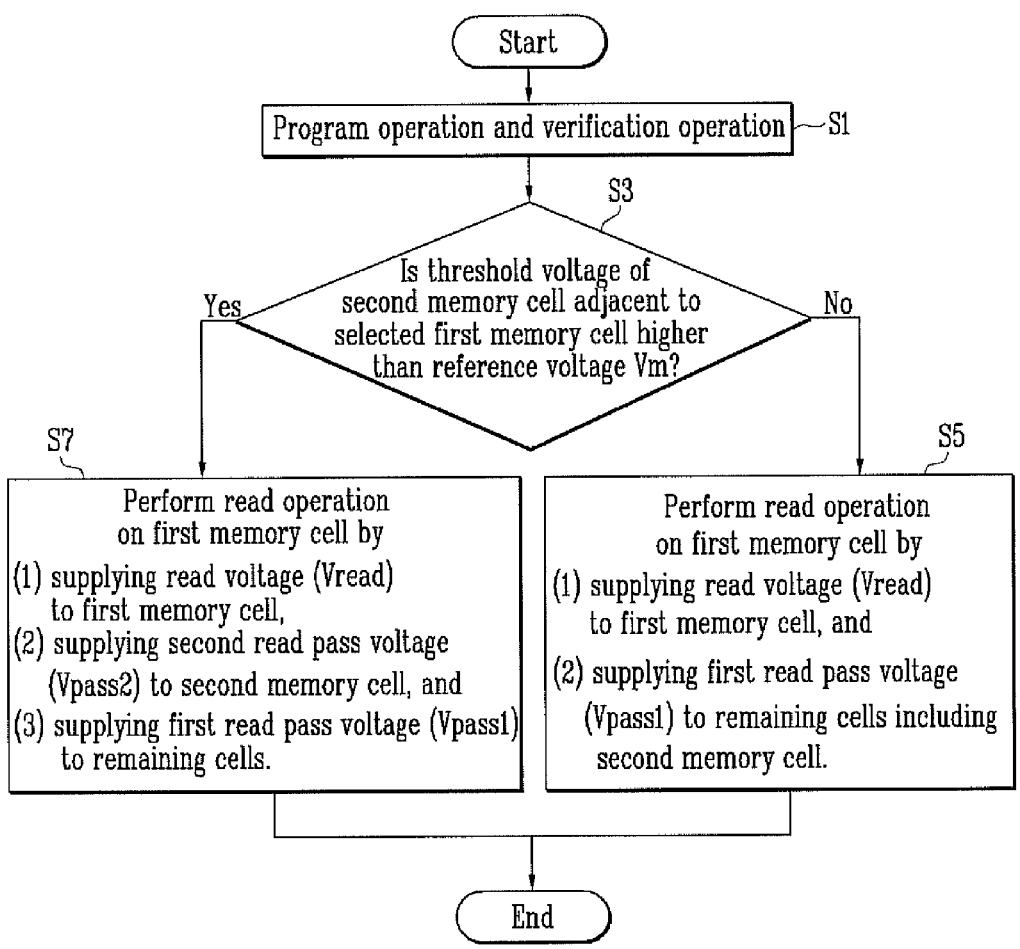
FIG. 6 is a flowchart illustrating an exemplary method of operating a nonvolatile memory device according to this disclosure.

An exemplary method of operating the nonvolatile memory device according to this disclosure is described below with reference to FIG. 6.

First, a program operation and a verification operation are performed on the memory cells MC0 to MC31 included in a cell string ST at step S1.

The memory cells of the cell string, as described above with reference to FIG. 3, are coupled in series between the source select transistor SST and the drain select transistor DST. In general, the program operation is sequentially performed from a memory cell adjacent to the source select transistor SST (e.g., MC0) to a memory cell adjacent to the drain select transistor DST (e.g., MC31). The threshold voltage of an earlier programmed memory cell can rise as a result of the program operation performed on subsequent memory cells. Accordingly, the degree of interference on the threshold voltage of the earlier programmed memory cell can be higher than that of later programmed memory cells. Consequently, there is a high probability that a memory cell close to the source select transistor, which is generally programmed early, has a threshold voltage higher than a reference voltage Vm.

The verification operation is an operation that determines whether a memory cell has been programmed with a target threshold voltage using a one or more verification voltages, after a program voltage is supplied to the memory cell during the program operation. Here, the verification voltage has a value set according to a target threshold voltage. In the case of an MLC, the verification operation is performed using a number of verification voltages.

After the program operation and the verification operation are performed on the memory cells, a threshold voltage of the second memory cell adjacent to the first memory cell is compared with the reference voltage Vm during a read operation at step S3.

The reference voltage Vm is used to determine whether a channel can be formed in the second memory cell, when the read voltage Vread is supplied to the first memory cell and the first read pass voltage Vpass1 for forming the channels in the remaining cells, including the second memory cell, is supplied.

Here, the first read pass voltage Vpass1 is calculated by taking the threshold voltages of the memory cells, which may be influenced by subsequent program operations or by Back Pattern Dependency (BPD), into consideration after the program operation and the verification operation are performed on the memory cells. In the case in which the read operation is performed on the first memory cell by supplying the first read pass voltage Vpass1 to the second memory cell, which is adjacent to the first memory cell, if the threshold voltage of the second memory cell is within a certain range, the channel can be formed in the second memory cell. However, if the threshold voltage of the second memory cell has risen to a voltage level that is higher than a certain range, the channel cannot be formed in the second memory cell even though the first read pass voltage Vpass1 is supplied to the second memory cell when the read operation is performed on the first memory cell.

The above reference voltage Vm preferably has a voltage level that is higher than the highest verification voltage of the verification voltages by a certain margin, but lower than the first read pass voltage Vpass1.

If, as a result of the comparison at step S3, a threshold voltage of the second memory cell is lower than or equal to the reference voltage Vm, it means that the threshold voltage of the second memory cell has not been raised to a voltage level that is higher than an expected range. In this case, during the read operation for the first memory cell, a channel may be formed in the second memory cell, even though the first read pass voltage Vpass1 is supplied to the second memory cell. Accordingly, the read operation is performed on the first memory cell by supplying the read voltage Vread to the first memory cell and the first pass voltage Vpass1 to the remaining cells including the second memory cell at step S5.

However, if, as a result of the comparison at step S3, a threshold voltage of the second memory cell is higher than the reference voltage Vm, it means that the threshold voltage of the second memory cell has risen to a voltage level that is higher than an expected range. In this case, during the read operation for the first memory cell, when the first read pass voltage Vpass1 is supplied to the second memory cell, a channel may not be formed in the second memory cell. To prevent this problem, when the threshold voltage of the second memory cell is higher than the reference voltage Vm, the read operation is performed on the first memory cell by supplying the read voltage Vread to the first memory cell, the second read pass voltage Vpass2, which is higher than the first read pass voltage Vpass1, to the second memory cell, and the first read pass voltage Vpass1 to the remaining cells at step S7.

The second read pass voltage Vpass2 is higher than the first read pass voltage Vpass1. Thus, although the threshold voltage of the second memory cell adjacent to the first memory cell has risen to a voltage level higher than an expected range, a channel can sufficiently be formed in the second memory cell. Consequently, the likelihood of an error occurring in the read operation for the first memory cell can be reduced. Meanwhile, in the case in which the threshold voltages of two memory cells adjacent to the first memory cell have risen higher than the reference voltage Vm, although the read operation is performed on the first memory cell by supplying the second read pass voltage Vpass2 to one of the two memory cells, a channel can overlap with the other cell. As described above, by supplying the second read pass voltage Vpass2 to only one of two memory cells without supplying it to both the two memory cells, stress applied to memory cells due to a risen read pass voltage can be reduced.

Here, it is assumed that a memory cell adjacent to the first memory cell on the side of the source select transistor has a higher threshold voltage than a memory cell adjacent to the first memory cell on the side of the drain select transistor due to an interference phenomenon because it is earlier programmed. Accordingly, in the case in which the first memory cell is not a memory cell adjacent to the source select transistor, a memory cell adjacent to the first memory cell on the side of the source select transistor preferably is selected as the second memory cell.

Meanwhile, in the case in which the first memory cell is a memory cell adjacent to the source select transistor, a memory cell adjacent to the first memory cell on the side of the drain select transistor preferably is selected as the second memory cell.

However, it may also be assumed that a memory cell adjacent to the first memory cell on the side of the drain select transistor has a higher threshold voltage than a memory cell adjacent to the first memory cell on the side of the source select transistor due to an interference phenomenon because it is earlier programmed. Under this assumption, in the case in which the first memory cell is not a memory cell adjacent to the drain select transistor, a memory cell adjacent to the first memory cell on the side of the drain select transistor preferably is selected as the second memory cell. Meanwhile, in the case in which the first memory cell is a memory cell adjacent to the drain select transistor, a memory cell adjacent to the first memory cell on the side of the source select transistor preferably is selected as the second memory cell.

Figure 7:
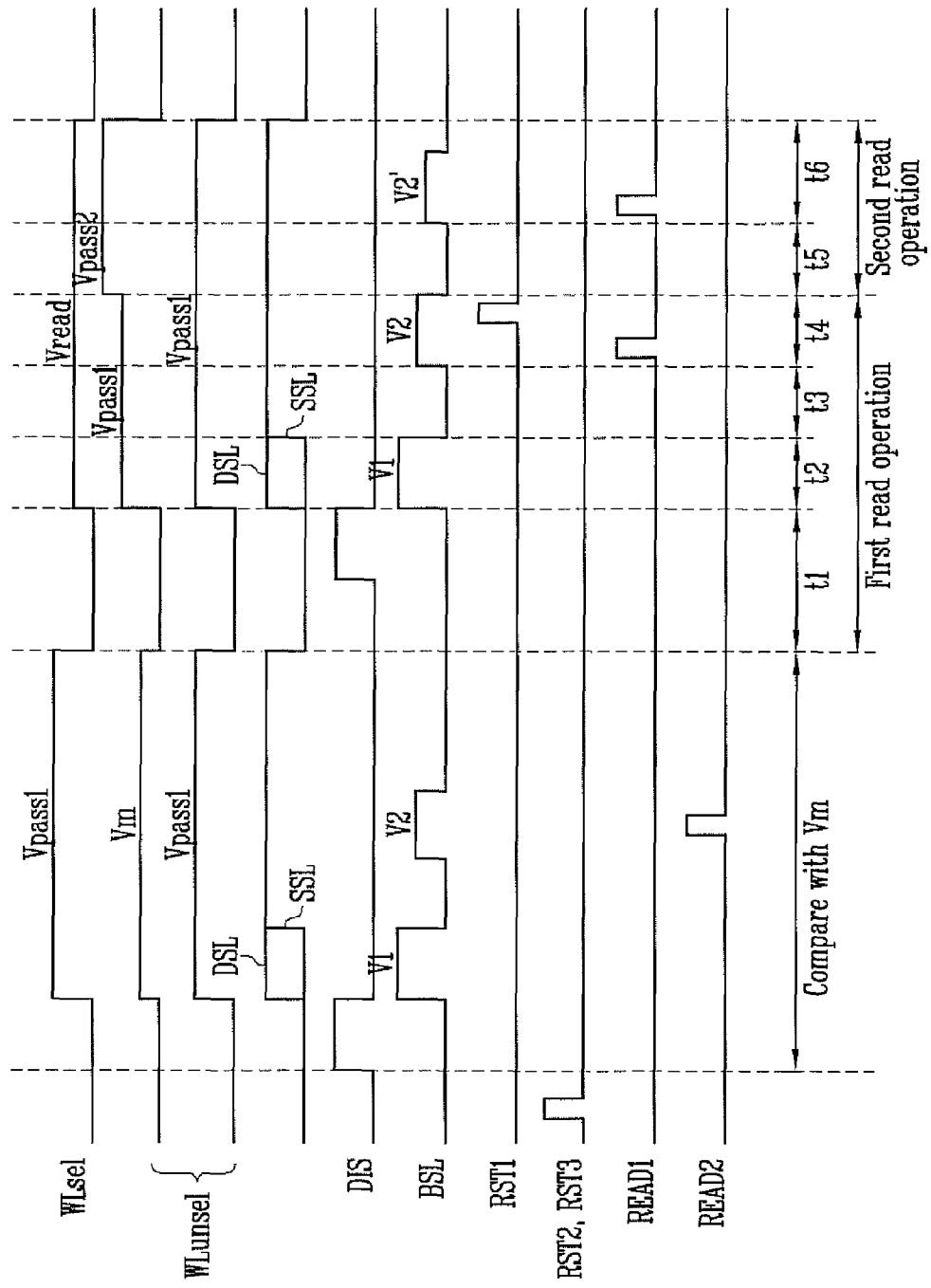
FIGS. 7 to 9 show waveforms illustrating signals during a read operation according to exemplary embodiments of this disclosure.
Figure 8:
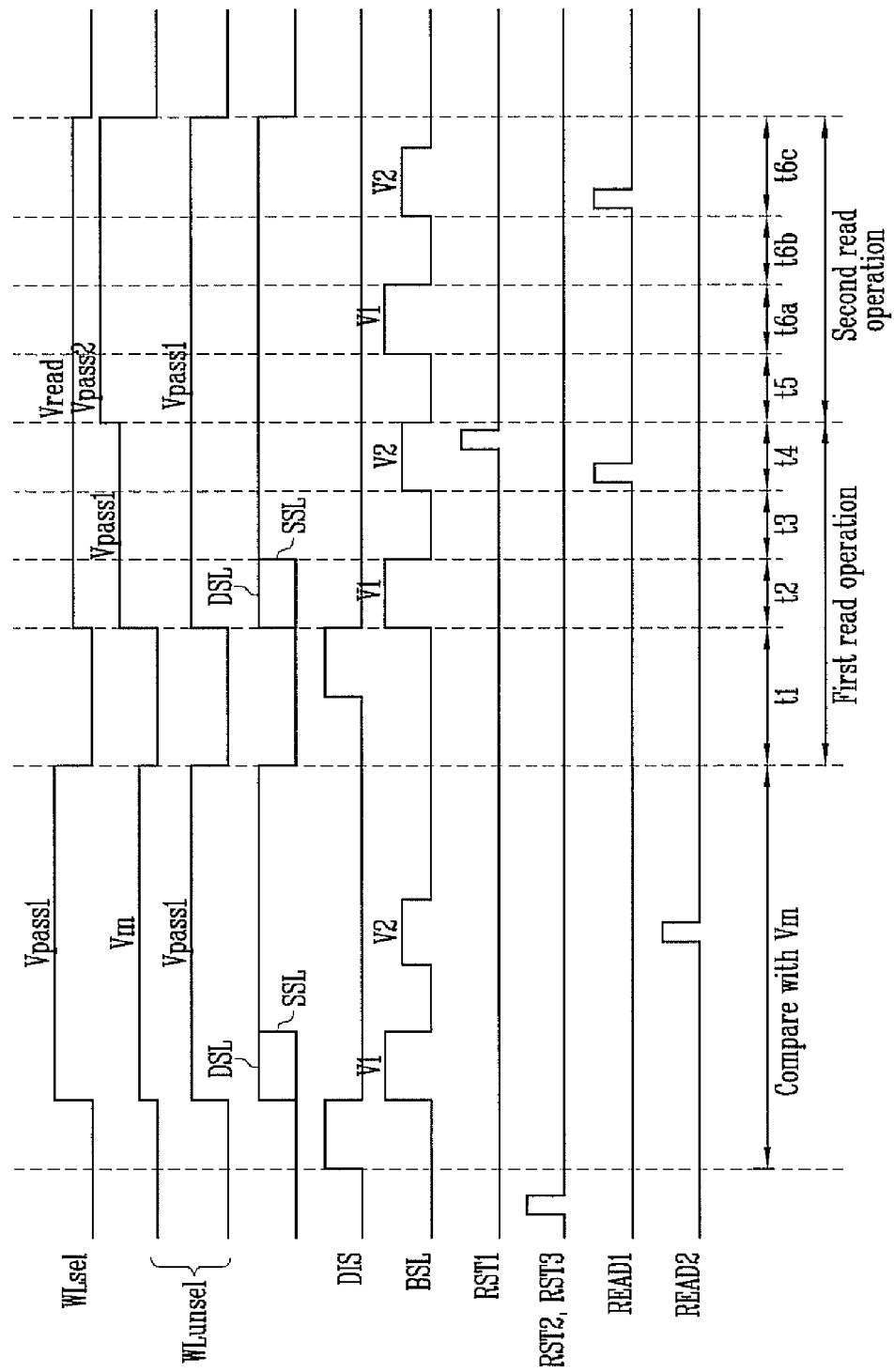
Figure 9:
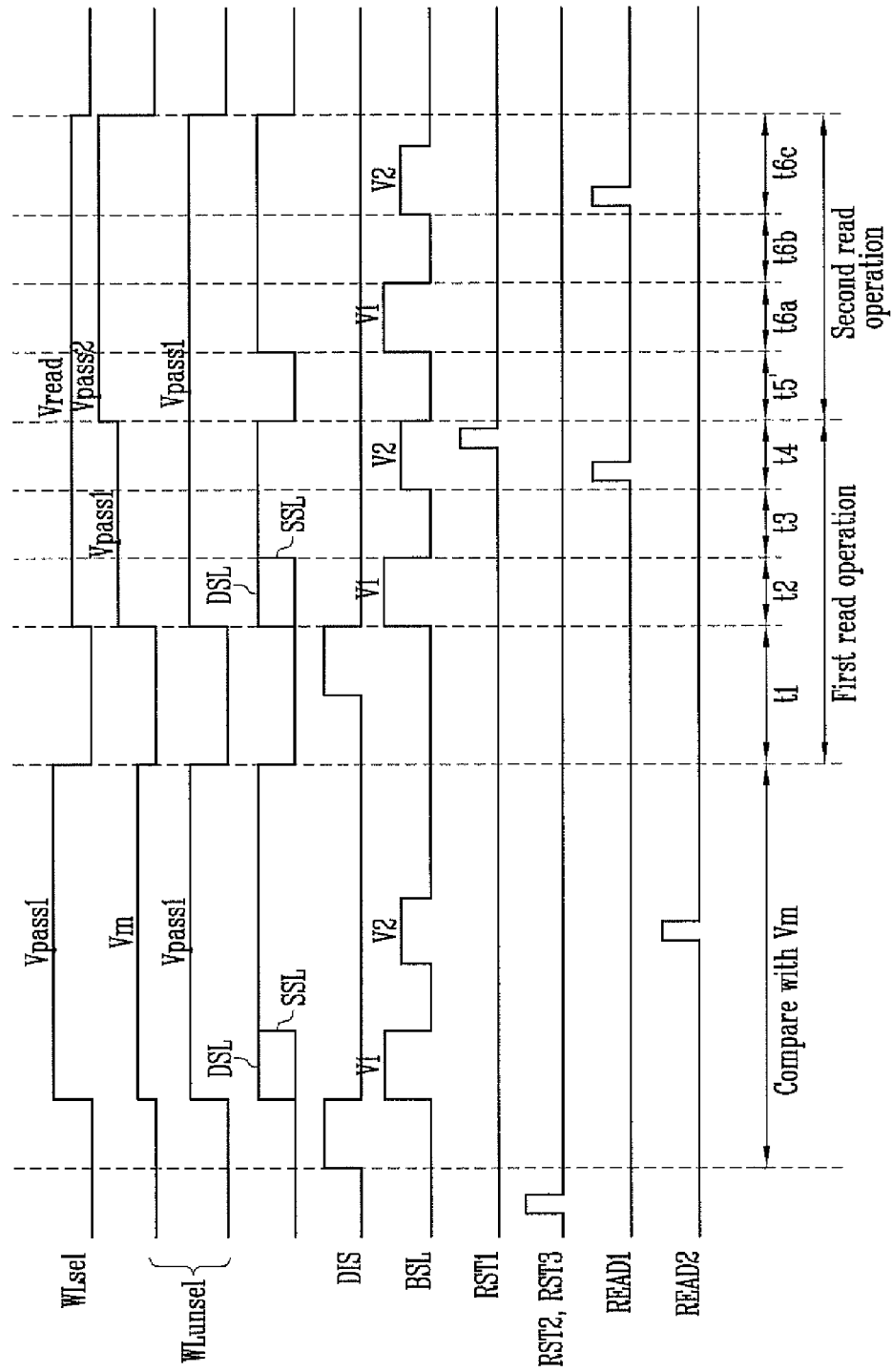

FIGS. 7 to 9 are waveforms illustrating operating methods of three exemplary embodiments of the nonvolatile memory device according to this disclosure. In particular, a read operation of a first memory cell, performed after a program operation and a verification operation are performed on the memory cells included in the same cell string as the first memory cell, is described with reference to FIGS. 7 to 9.

Referring to FIG. 7, during the read operation according to a first exemplary embodiment of this disclosure, the second and third reset control signals RST2, RST3 are supplied to the second and third reset transistors N11, N12, respectively, in order to reset data of the first and second latches 125, 126.

Next, the threshold voltage of a second memory cell adjacent to the first memory cell, selected from among the memory cells, is compared with a reference voltage Vm. A result of the comparison is stored in the first latch 125. This operation is described in more detail below.

First, bit lines coupled to the memory cells are discharged. To discharge the bit lines, a discharge signal DIS is enabled. The discharge signal DIS can be any one of the even and odd discharge signals DISe and DISo. After the bit lines are discharged, a bit line selected from among the bit lines is precharged. To this end, the selected bit line and the corresponding cell string are coupled together by the drain select transistor DST, which is turned on by a power source voltage (e.g., 4.5 V) supplied to the drain selection line DSL.

Next, the sense node SO is precharged to a power source voltage level through the precharge unit 123. The bit line sense signal BSL having the first voltage V1 is supplied to the bit line sense transistor N5 of the bit line detector 122. Also, the selected bit line and the sense node SO, precharged to a high voltage level, are coupled together in response to the bit line selection signal (e.g., BSELe). Consequently, the selected bit line is precharged to a specific voltage level.

Meanwhile, during the period in which the selected bit line is precharged, the first read pass voltage Vpass1 is supplied to a selected word line WLsel coupled to the first memory cell. Further, the reference voltage Vm is supplied to an unselected word line WLunsel coupled to the second memory cell, which is adjacent to the first memory cell, and the first pass voltage Vpass1 is supplied to the unselected word lines WLunsel coupled to the remaining memory cells (i.e., those memory cells in the same cell string except for the first memory cell and the second memory cell).

After the selected bit line is precharged, a threshold voltage of the second memory cell is evaluated according to a change in the voltage level of the selected bit line. To this end, a power source voltage (e.g., 4.5 V) is supplied to the source selection line SSL to turn-on the source select transistor SST, thereby forming a current path from the selected bit line to the common source line CSL. The bit line sense signal BSL of a high logic level (i.e., the first voltage V1) shifts to a low logic level so that the connection between the selected bit line and the sense node SO is disconnected. Consequently, the voltage level of the selected bit line is changed according to the threshold voltage of the second memory cell.

More specifically, when the threshold voltage of the second memory cell is higher than the reference voltage Vm, the voltage level of the selected bit line maintains a high voltage level. However, when the threshold voltage of the second memory cell is equal to or lower than the reference voltage Vm, the voltage level of the selected bit line drops from a specific voltage level to a low voltage level.

Next, first data according to the voltage level of the selected bit line is detected. However, before the first data is detected, the precharge signal PRECHb shifts from a low voltage level to a high voltage level, and so the connection between the sense node SO and the power source voltage is disconnected.

To detect the first data, the bit line sense signal BSL of a low logic level shifts to the second voltage V2, which is lower than the first voltage V1. Consequently, whether the bit line sense transistor N5 will be turned on or off is determined according to the voltage level of the selected bit line.

More particularly, when the voltage level of the selected bit line is lower than a voltage difference between the second voltage V2 and a threshold voltage of the bit line sense transistor N5 (hereinafter referred to as 'V2−Vt'), the bit line sense transistor N5 is turned on. Consequently, the sense node SO and the selected bit line are coupled together, and so a charge sharing phenomenon is generated between the selected bit line and the sense node SO. Accordingly, when the voltage level of the selected bit line is lower than the voltage difference V2−Vt, the voltage level of the sense node SO is lowered. In the case in which the voltage level of the sense node SO is lowered from the precharged voltage level, although the second latch control signal READ2 of a high voltage level is supplied during the time in which the second voltage V2 is supplied, the ground voltage input terminal and the first latch 125 are not coupled together because the first transistor N7 is in the off state. Accordingly, data of a low logic level (i.e., '0') (i.e., initial data) is stored in the first latch node QB of the first latch 125.

However, when the voltage level of the selected bit line is higher than the voltage difference V2−Vt, the sense node SO and the selected bit line are not coupled together because the bit line sense transistor N5 is in the off state. Accordingly, the voltage level of the sense node SO maintains a high voltage level. As described above, when the voltage level of the sense node SO corresponds to a high logic level, the first transistor N7 is turned on. Accordingly, when the second latch control signal READ2 of a high level is supplied during the time for which the second voltage V2 is supplied, the ground voltage input terminal and the first latch 125 are coupled together. Consequently, data of a high logic level (i.e., '1') is stored in the first latch node QB of the first latch 125.

As described above, a change in the voltage level of the selected bit line can be detected based on a change in the voltage level of the sense node SO by supplying the bit line sense transistor N5 with the second voltage V2, which is lower than the first voltage V1. Data according to a change in the voltage level of the sense node SO is stored in the first latch 125. The data according to a change in the voltage level of the sense node SO is a result of comparing a threshold voltage of the second memory cell and the reference voltage Vm. Accordingly, the data stored in the first latch 125 is a result of comparing a threshold voltage of the second memory cell and the reference voltage Vm.

Next, first and second read operations for reading data stored in the first memory cell are performed.

The first read operation is performed during first to fourth periods t1, t2, t3, and t4 as described below.

(1) First period t1: period in which bit line is discharged

During the first period t1, the discharge signal DIS is enabled. The discharge signal DIS can be any one of the even and odd discharge signal DISe and DISo.

(2) Second period t2: period in which bit line is precharged

During the second period t2, the cell string and the selected bit line are coupled together through the drain select transistor DST, which is turned on by supplying a power source voltage (e.g., 4.5 V) to the drain selection line DSL. Furthermore, the selected bit line is precharged to a high voltage level. To this end, the sense node SO is precharged to a power source voltage level through the sense node precharge unit 123. The bit line sense signal BSL having the first voltage V1 is supplied to the bit line sense transistor N5 of the bit line detector 122, and the bit line selection signal (e.g., BSELe) is supplied to the NMOS transistor (e.g., N1) corresponding to the selected bit line. Accordingly, the sense node SO, precharged to a high voltage level, and the selected bit line are coupled together. Consequently, the selected bit line is precharged to a specific voltage level.

Meanwhile, the read voltage Vread is supplied to the selected word line WLsel coupled to the first memory cell. The first read pass voltage Vpass1 is supplied to the unselected word lines WLunsel coupled to the remaining unselected memory cells (i.e., the memory cells other than the first memory cell).

(3) Third period t3; period in which whether the first memory cell has been programmed is evaluated After the selected bit line is precharged to the specific voltage level, whether the first memory cell has been programmed is evaluated according to a change in the voltage level of the selected bit line. Meanwhile, the source select transistor SST is turned on by supplying a power source voltage (e.g., 4.5 V) to the source selection line SSL. Accordingly, the cell string is coupled to the common source line CSL through which a ground voltage is supplied, and thus, a current path from the selected bit line to the common source line CSL is formed.

To evaluate whether the first memory cell has been programmed, the bit line sense signal BSL of a high logic level (i.e., the first voltage V1) shifts to a low logic level so that the connection between the selected bit line and the sense node SO is disconnected. During the third period t3, a voltage level of the selected bit line is changed according to whether the first memory cell has been programmed and to a threshold voltage of the second memory cell.

More particularly, in the case in which the first memory cell has been correctly programmed with a target threshold voltage, the voltage level of the selected bit line is maintained. Furthermore, even when the first memory cell has not been correctly programmed with the target threshold voltage, if the threshold voltage of the second memory cell is higher than the reference voltage Vm, the voltage level of the selected bit line is maintained because a current path is not formed in the cell string.

However, in the case in which the first memory cell is a program fail cell (i.e., the first memory cell is not correctly programmed with the target threshold voltage) and the threshold voltage of the second memory cell is equal to or lower than the reference voltage Vm, the voltage level of the selected bit line drops from the specific voltage level to a low voltage level.

(4) Fourth period t4: first sense period in which data of first memory cell is detected During the fourth period t4, data based upon whether the first memory cell has been programmed is detected according to the voltage level of the selected bit line. Meanwhile, before the fourth period t4 is started, the precharge signal PRECHb shifts from a low logic level to a high logic level so that the connection between the sense node SO and the power source voltage is disconnected. Next, during the fourth period t4, the first latch control signal READ1 is supplied to the second transistor N8.

When the first latch control signal READ1 is supplied, the second transistor N8 is turned on, and so the first transistor N7 and the second latch 126 are coupled together. Furthermore, during the fourth period t4, to detect data according to whether the first memory cell has been programmed, the bit line sense signal BSL of a low logic level shifts to the second voltage V2, which is lower than the first voltage V1. Consequently, during the fourth period t4, whether the bit line sense transistor N5 will be turned on or off is determined and a voltage level of the sense node SO is determined according to a voltage level of the selected bit line.

More particularly, if the threshold voltage of the second memory cell is equal to or lower than the reference voltage Vm and the first memory cell has not been programmed with the target threshold voltage, the voltage level of the selected bit line becomes lower than the voltage difference V2−Vt. In this case, the bit line sense transistor N5 is turned on. Consequently, the sense node SO and the selected bit line are coupled together, and so a charge sharing phenomenon is generated between the selected bit line and the sense node SO. Accordingly, the voltage level of the sense node SO is lowered. When the voltage level of the sense node SO is lowered as described above, although the first latch control signal READ1 of a high logic level is supplied during the time in which the second voltage V2 is supplied, the ground voltage input terminal and the second latch 126 are not coupled together because the first transistor N7 is in the off state. Consequently, data of a low logic level (i.e., '0') (i.e., initial data) is stored in the third latch node QA of the second latch 126.

However, in the case in which the first memory cell has been programmed to have the target threshold voltage or higher, the voltage level of the selected bit line is higher than the voltage difference V2−Vt. In this case, the sense node SO and the selected bit line are not coupled together because the bit line sense transistor N5 is in the off state. Accordingly, the voltage level of the sense node SO is maintained at a high voltage level. When the voltage level of the sense node SO is a high level as described above, the first transistor N7 is turned on. Accordingly, when the first latch control signal READ1 of a high level is supplied during the time in which the second voltage V2 is supplied, the ground voltage input terminal and the second latch 126 are coupled together. Consequently, data of a high logic level (i.e., '1') is stored in the third latch node QA of the second latch 126.

Meanwhile, although the first memory cell has not been programmed with the target threshold voltage, if the threshold voltage of the second memory cell is higher than the reference voltage Vm, the voltage level of the selected bit line is higher than the voltage difference V2−Vt because a current path from the selected bit line to the common source line CSL is not formed. Even in this case, the voltage level of the sense node SO is maintained at a high voltage level. Accordingly, when the first latch control signal READ1 is supplied, data of a high logic level (i.e., '1') is stored in the third latch node QA of the second latch 126.

After the first latch control signal READ1 is supplied, the first reset control signal RST1 of a high logic level (i.e., '1') is supplied. Accordingly, during the fourth period t4, the data stored in the second latch 126 is maintained or reset according to data stored in the first latch node QB of the first latch 125.

More particularly, when the data stored in the first latch 125 is data of a low logic level (i.e., '0'), the data stored in the second latch 126 remains intact until the second reset control signal RST2 of a high logic level is supplied again.

However, when the data stored in the first latch 125 is data of a high logic level (i.e., '1'), the first reset transistor N10 of the first reset unit 127a is turned on, and so the data stored in the second latch 126 is reset.

When the data read by the first read operation is reset, the second read operation is performed. The second read operation is performed during fifth and sixth periods t5, t6.

(5) Fifth period t5: period in which sense node is precharged

During the fifth period t5, the bit line sense signal BSL shifts to a low logic level so that the connection between the selected bit line and the sense node SO is disconnected. The sense node SO is precharged to a power source voltage level through the precharge unit 123. Meanwhile, the first pass voltage Vpass1, supplied to the unselected word line WLunsel that is coupled to the second memory cell, is increased to the second pass voltage Vpass2.

(6) Sixth period t6: period in which data of first memory cell is detected

After the data stored in the second latch 126 is reset, the bit line sense signal BSL of a low logic level shifts to a third voltage V2' in order to detect data according to whether the first memory cell has been programmed. Meanwhile, before the sixth period t6 is started, the precharge signal PRECHb of a low logic level shifts to a high logic level so that the connection between the sense node SO and the power source voltage is disconnected. Next, during the sixth period t6, the first latch control signal READ1 is supplied to the second transistor N8.

The third voltage V2' preferably is set lower than the second voltage V2 with consideration taken of the charges of the selected bit line lost during the previous period. When the third voltage V2' is supplied, whether the bit line sense transistor N5 is turned-on or turned-off is determined according to a voltage level of the selected bit line.

Meanwhile, since the second pass voltage Vpass2, which is higher than the first pass voltage Vpass1, is supplied to the second memory cell during the sixth period t6, a channel can be formed in the second memory cell although a threshold voltage of the second memory cell is higher than the reference voltage Vm. Accordingly, during the sixth period t6, the voltage level of the selected bit line is determined according to whether the first memory cell has been programmed irrespective of the threshold voltage of the second memory cell.

More particularly, if the first memory cell is a program fail cell, the voltage level of the selected bit line becomes lower than a difference between the third voltage V2' and a threshold voltage of the bit line sense transistor N5 (hereinafter referred to as V2'−Vt). In this case, since the bit line sense transistor N5 is turned on, the sense node SO and the selected bit line are coupled together, and so a charge sharing phenomenon is generated between the selected bit line and the sense node SO. Consequently, a voltage level of the sense node SO is lowered. When the voltage level of the sense node SO is lowered, as described above, data of a low logic level (i.e., '0') (i.e., initial data) is stored in the third latch node QA although the first latch control signal READ1 of a high logic level (i.e., '1') is supplied.

However, if the first memory cell has been programmed with a target threshold voltage, the voltage level of the selected bit line is higher than the voltage difference V2'–Vt, and so the bit line sense transistor N5 is turned off. In this case, since the sense node SO and the selected bit line are not coupled together, a voltage level of the sense node SO is maintained at a high voltage level. Here, when the first latch control signal READ1 is supplied, data of a high logic level (i.e., '1') is stored in the third latch node QA of the second latch 126.

Referring to FIG. 8, in the read operation according to a second exemplary embodiment of this disclosure, and in accordance with the same method as described above with reference to FIG. 7, data of the first and second latches 125, 126 are reset, a threshold voltage of the second memory cell is compared with the reference voltage Vm, and a result of the comparison is stored in the first latch 125. Furthermore, in the second exemplary embodiment of this disclosure, a first read operation is performed on the first memory cell in the same manner as described above with reference to FIG. 7.

Next, in the second exemplary embodiment of this disclosure, when data read by the first read operation is reset, a second read operation is performed in the same manner as described above with reference to FIG. 7. The second read operation according to the second exemplary embodiment of this disclosure is performed during fifth and sixth periods t5, t6a, t6b, and t6c.

The operation of the fifth period t5 according to the second exemplary embodiment of this disclosure is the same as that of the fifth period t5 described above with reference to FIG. 7.

The sixth period t6a to t6c according to the exemplary second embodiment of this disclosure includes a period t6a in which a bit line is precharged, a period t6b in which whether the first memory cell has been programmed is evaluated, and a period t6c in which data of the first memory cell is detected.

During the period t6a, the bit line sense signal BSL having the first voltage V1 is supplied to the bit line sense transistor N5 of the bit line detector 122, and the bit line selection signal (e.g., BSELe) is supplied to the corresponding NMOS transistor (e.g., N1) so that the selected bit line and the sense node SO precharged to a high level are coupled together. Consequently, since the selected bit line can be precharged to a specific voltage level, although the changes of the selected bit line are lost during periods prior to the period t6a, the lost charges can be compensated for.

Next, during the period t6b, whether the first memory cell has been programmed is evaluated according to a change in a voltage level of the selected bit line.

To evaluate whether the first memory cell has been programmed, the bit line sense signal BSL of a high logic level (i.e., the first voltage V1) shifts to a low logic level in order to turn off the bit line sense transistor N5. Accordingly, the connection between the selected bit line and the sense node SO is disconnected.

Since the second pass voltage Vpass2 is supplied to the second memory cell during the period t6b, a channel can be formed in the second memory cell although a threshold voltage of the second memory cell is higher than the reference voltage Vm. Accordingly, during the period t6b, a voltage level of the selected bit line is determined according to whether the first memory cell has been programmed, irrespective of a threshold voltage of the second memory cell.

More particularly, if the first memory cell has been correctly programmed with a target threshold voltage, a voltage level of the selected bit line is maintained at a high voltage level. However, if the first memory cell is a program fail cell (i.e., the first memory cell is not programmed with the target threshold voltage), a voltage level of the selected bit line is lowered from a specific voltage level to a low voltage level.

Next, during the period t6c, data based upon whether the first memory cell has been programmed is detected according to a voltage level of the selected bit line. Such an operation is the same as described above in connection with the first exemplary embodiment.

Referring to FIG. 9, in the read operation according to the third exemplary embodiment of this disclosure, and in accordance with the same method as described above with reference to FIG. 7, data of the first and second latches 125, 126 are reset, a threshold voltage of the second memory cell is compared with the reference voltage Vm, and a result of the comparison is stored in the first latch 125. Furthermore, in the third exemplary embodiment of this disclosure, a first read operation is performed on the first memory cell in the same manner as described above with reference to FIG. 7.

Next, in the third exemplary embodiment of this disclosure, when data read by the first read operation is reset, a second read operation is performed in the same manner as described above with reference to FIG. 7. The second read operation according to the third exemplary embodiment of this disclosure is performed during fifth and sixth periods t5', t6a, t6b, and t6c.

An operation in the fifth period t5' according to the third embodiment of this disclosure is the same as the fifth period t5 shown in FIG. 7, except that a turn-off voltage is supplied to the drain selection line DSL and the source selection line SSL. Accordingly, in the third exemplary embodiment of this disclosure, to perform the first read operation on the first memory cell, the drain select transistor DST and the source select transistor SST are turned off during the fifth period t5' in which the sense node SO is precharged. When the drain selection transistor DST and the source select transistor SST are turned off during the fifth period t5' as in the third exemplary embodiment of this disclosure, the loss of charges in the selected bit line can be improved.

The sixth periods t6a to t6c according to the third exemplary embodiment of this disclosure are the same as the sixth periods t6a to t6c according to the second exemplary embodiment described with reference to FIG. 8.

In accordance with this disclosure, in the case in which the threshold voltage of a second memory cell, adjacent to a selected first memory cell, rises, the first read pass voltage is supplied to the word line of the second memory cell during a read operation of the first memory cell. Accordingly, whether a channel can be formed in the second memory cell can be determined using a reference voltage having a specific level.

Further, in accordance with this disclosure, if a threshold voltage of the second memory cell has risen more than a reference voltage, the read pass voltage supplied to the second memory cell is raised from the first read pass voltage to the second read pass voltage, and a threshold voltage of the first memory cell is then read. Accordingly, a difference between voltage supplied to the gate of the second memory cell and a threshold voltage of the second memory cell can be increased during the read operation for the first memory cell. Consequently, although a threshold voltage of the second memory cell has risen, a channel can be sufficiently formed beneath the gate of the second memory cell. Accordingly, the likelihood of an error occurring in the read operation for the first memory cell can be reduced.

What is claimed is:

1. A nonvolatile memory device, comprising:
   a cell string configured to include a drain select transistor coupled to a bit line, a source select transistor coupled to a common source line, and a number of memory cells coupled in series between the drain select transistor and the source select transistor;
   a latch unit configured to include a first latch and a second latch, the first latch storing a detection result of a threshold voltage of a second memory cell adjacent to a first memory cell selected from among the memory cells, and the second latch storing a detection result of a threshold voltage of the first memory cell;
   a bit line coupling unit configured to electrically couple the bit line and the latch unit together; and
   a first reset unit electrically coupled between the first and second latches and configured to reset the second latch, during a time in which a read operation is performed on the first memory cell, in response to a first reset signal and the detection result stored in the first latch.

2. The nonvolatile memory device of claim 1, wherein the first reset unit comprises:
   an AND gate outputting data obtained by performing an AND operation on the first reset signal and the detection result stored in the first latch; and
   a first reset transistor coupling a ground voltage input terminal and the second latch unit together in response to the data output by the AND gate.

3. The nonvolatile memory device of claim 1, wherein the latch unit comprises:
   a first transistor supplying a ground voltage in response to a voltage level of the bit line;
   a second transistor coupling the second latch and the first transistor together in response to a first latch control signal; and
   a third transistor coupling the first latch and the first transistor in response to a second latch control signal.

4. The nonvolatile memory device of claim 1, further comprising a second reset unit coupled to the second latch and configured to reset the second latch in response to a second reset control signal.

5. The nonvolatile memory device of claim 1, further comprising a third reset unit coupled to the first latch and configured to reset the first latch in response to a third reset control signal.

6. The nonvolatile memory device of claim 1, wherein if the first memory cell is not a memory cell adjacent to the source select transistor, the second memory cell is a memory cell adjacent to the first memory cell on a side of the source select transistor.

7. The nonvolatile memory device of claim 1, wherein if the first memory cell is a memory cell adjacent to the source select transistor, the second memory cell is a memory cell adjacent to the first memory cell on a side of the drain select transistor.

8. A method of operating a nonvolatile memory device, comprising a cell string in which a number of memory cells, on which a program operation and a verification operation using a number of verification voltages have been performed, are coupled in series, the method comprising:
   comparing a threshold voltage of a second memory cell, adjacent to a first memory cell, which is selected from among the memory cells during a read operation, and a reference voltage, which is higher than a highest verification voltage of the verification voltages, but lower than a first read pass voltage; and
   performing the read operation on the first memory cell by supplying a read voltage to the first memory cell, a second read pass voltage, which is higher than the first read pass voltage, to the second memory cell, and the first read pass voltage to remaining memory cells, when the threshold voltage of the second memory cell is higher than the reference voltage.

9. The method of claim 8, further comprising, performing the read operation on the first memory cell by supplying the read voltage to the first memory cell and the first read pass voltage to remaining memory cells, including the second memory cell, when the threshold voltage of the second memory cell is lower than the reference voltage.

10. The method of claim 8, wherein if the first memory cell is not a memory cell adjacent to a source select transistor, the second memory cell is a memory cell adjacent to the first memory cell on a side of the source select transistor.

11. The method of claim 8, wherein if the first memory cell is a memory cell adjacent to a source select transistor, the second memory cell is a memory cell adjacent to the first memory cell on a side of a drain select transistor.

12. A method of operating a nonvolatile memory device, comprising a drain select transistor coupled to a bit line, a source select transistor coupled to a common source line, and a number of memory cells coupled in series between the drain select transistor and the source select transistor, the method comprising:
   performing a program operation and a verification operation;
   comparing a threshold voltage of a second memory cell, adjacent to a first memory cell, which is selected from among the memory cells for a read operation, and a reference voltage, which is higher than a highest verification voltage of the verification voltages, but lower than a first read pass voltage supplied to unselected memory cells during the read operation;
   performing a first read operation for reading data stored in the first memory cell by supplying a read voltage to the first memory cell and the first read pass voltage to the unselected memory cells;
   resetting the data read by the first read operation, when the threshold voltage of the second memory cell is higher than the reference voltage; and
   performing a second read operation for reading data stored in the first memory cell by supplying the read voltage to the first memory cell, a second read pass voltage, which is higher than the first read pass voltage, to the second memory cell, and the first read pass voltage to remaining memory cells, when the data read by the first read operation is reset.

13. The method of claim 12, wherein comparing the threshold voltage of the second memory cell and the reference voltage comprises:
   discharging the bit line;
   supplying a first voltage to a transistor electrically coupled between the bit line and a sense node to turn on the transistor;
   turning off the transistor; and
   detecting a change in a voltage level of the sense node by supplying a second voltage, which is lower than the first voltage, to the transistor.

14. The method of claim 13, wherein data according to the change in the voltage level of the sense node is stored in a first latch electrically coupled to the sense node.

15. The method of claim 12, wherein performing the first read operation comprises:
   discharging the bit line;

supplying a first voltage to a transistor electrically coupled between the bit line and a sense node to turn on the transistor;

turning off the transistor; and detecting a change in a voltage level of the sense node by supplying a second voltage, which is lower than the first voltage, to the transistor.

16. The method of claim 15, wherein detecting the change in the voltage level of the sense node is performed using a first transistor for supplying a ground voltage in response to the voltage level of the sense node, and a second transistor coupled to the first transistor in response to a first latch control signal.

17. The method of claim 16, wherein data according to the change in the voltage level of the sense node is stored in a second latch electrically coupled to the sense node.

18. The method of claim 17, wherein the sense node and the second latch are electrically coupled together through the first transistor and the second transistor, which couples the second latch and the first transistor together in response to the first latch control signal.

19. The method of claim 14, wherein the sense node and the first latch are electrically coupled together through a first transistor for supplying a ground voltage in response to the voltage level of the sense node and a third transistor for coupling the first latch and the first transistor together in response to a second latch control signal.

20. The method of claim 12, wherein resetting the data read by the first read operation is performed using a first reset transistor responding to a signal obtained by performing an AND operation of a first reset control signal and data according to a result of comparing the threshold voltage of the second memory cell and the reference voltage.

21. The method of claim 17, further comprising resetting the second latch using a second reset transistor for resetting the second latch in response to a second reset control signal, before comparing the threshold voltage of the second memory cell and the reference voltage.

22. The method of claim 14, further comprising resetting the first latch using a third reset transistor for resetting the first latch in response to a third reset control signal, before comparing the threshold voltage of the second memory cell and the reference voltage.

23. The method of claim 15, wherein performing the second read operation comprises:

turning off the transistor; and detecting a change in a voltage level of the sense node by supplying a third voltage, which is lower than the second voltage to the transistor.

24. The method of claim 15, wherein performing the second read operation comprises:

turning off the transistor and precharging the sense node;

turning on the transistor by supplying the first voltage to the transistor;

turning off the transistor; and detecting a change in a voltage level of the sense node by supplying the second voltage, which is lower than the first voltage, to the transistor.

25. The method of claim 24, wherein the drain select transistor and the source select transistor are turned off during a time in which the sense node is precharged in the second read operation.

* * * * *